United States Patent [19]
Fujisawa et al.

[11] Patent Number: 5,160,897
[45] Date of Patent: Nov. 3, 1992

[54] PUSH-PULL POWER AMPLIFYING CIRCUIT

[75] Inventors: Masanori Fujisawa, Kumagaya; Kenichi Kokubo, Tatebayashi, both of Japan

[73] Assignee: Sanyo Electric Co., Ltd., Osaka, Japan

[21] Appl. No.: 751,949

[22] Filed: Aug. 29, 1991

[30] Foreign Application Priority Data

Aug. 30, 1990 [JP] Japan .................. 2-230433

[51] Int. Cl.$^5$ .............................. H03F 3/30
[52] U.S. Cl. ........................................ 330/274
[58] Field of Search ............... 330/265, 267, 268, 271, 330/273, 274

[56] References Cited

U.S. PATENT DOCUMENTS 4,316,149  2/1982  Yamaguchi ................. 330/268
4,833,424  5/1989  Wright ........................ 330/267

FOREIGN PATENT DOCUMENTS 2441540   5/1984  Japan .
124315   11/1984  Japan .
6433134   8/1988  Japan .

Primary Examiner—James B. Mullins
Attorney, Agent, or Firm—Armstrong & Kubovcik

[57] ABSTRACT

The present invention provides a B class push-pull amplifying circuit suitable for use in a headphone type tape recorder and the like. The amplifying circuit utilizes a current mirror circuit system in its output transistors to provide an idling current for compensating for crossover distortion by using the mirror ratio. The current mirror circuit system includes a pair of output current mirror circuits complimentarily coupled with each other. One branch of these output current mirror circuits includes a diode-connected transistor, the emitter current path of which is ON-OFF controlled by a drive transistor in the other branch. Thus, when no signal is input, the respective one of the current mirror output circuits complimentarily coupled with each other functions as a current mirror circuit such that the small idling current determined by the mirror ratio will pass therethrough. On the other hand, the inputting of a signal causes the output of the opposite side drive transistor to make the current mirror circuit inoperative. The output transistor functions as a normal amplifying circuit. An amplification factor $h_{FE}$ provided at this time can reliably assure a sufficiently large amplification degree.

5 Claims, 2 Drawing Sheets

5,160,897

PUSH-PULL POWER AMPLIFYING CIRCUIT

BACKGROUND OF THE INVENTION

1. Field of the Invention:

The present invention relates to an amplifying circuit for push-pull amplifying an input signal and more particularly to a push-pull power amplifying circuit of such a type that crossover distortion is compensated for by supplying an idling current through a current mirror circuit while reducing the current consumption.

2. Description of the Related Art:

Heretofore, the output stage of audio instruments such as radios, tape recorders and so on has amplified input signals through such a push-pull amplifying circuit as shown in FIG. 2.

One such push-pull amplifying circuit is disclosed in Japanese Patent Laid-Open No. Sho 59-19415. As is well-known in the art, B class push-pull power amplifying circuits utilizing transistors are advantageous in that the power consumption at its output can be decreased. However, such a push-pull power amplifying circuit raises a problem in that the on-off operation of a complementary output transistor defining the output of the circuit causes crossover distortion in the output signal.

In the prior art system, such crossover distortion has been removed by using two current mirror circuits so that a small constant current passes through the output transistor even in a no signal state. Such a small constant current is known as idling current".

Referring now to FIG. 2, there is shown an amplifying circuit 1 which mainly comprises a first drive stage A1, a second drive stage A2, a first output stage including a current mirror circuit which is adapted to supply the idling current and includes transistors Tr7 and Tr11, and a second output stage including another current mirror circuit which is similarly adapted to supply the idling current and includes transistors Tr9 and Tr12.

It is assumed herein that the ratio of the emitter areas of the transistors Tr7 and Tr11 to the emitter areas of the transistors Tr9 and Tr12 is 1:N (where N is a positive real number).

An input signal A is applied to the first drive stage A1. The output current of the first drive stage A1 is supplied to the collector and base of the transistor Tr7. The transistors Tr7 and Tr11 are connected to each other in a current mirror relationship. Since the ratio of current mirroring is set to be 1:N, the collector current of the transistor Tr11 will be $N \times I1$ if the output current of the first drive stage A1 is I1 (=I1DC+I1AC where I1DC is direct current and I1AC is alternating current). This collector current is then supplied to a capacitor C1 and a resistor R5 which is a load such as speaker or the like.

On the other hand, another input signal $\overline{A}$ having a phase opposite to that of the input signal A is applied to the second drive stage A2. The output current of the second drive stage A2 is supplied to the collector and base of the transistor Tr9. The transistors Tr9 and Tr12 are connected to each other in a current mirror relationship. Since the ratio of current mirroring is set to be 1:N, the collector current of the transistor Tr12 will be $N \times I2$ if the output current of the second drive stage A2 is I2 (=I2DC+I2AC where I2DC is direct current and I2AC is alternating current). This collector current is then supplied to the resistor R5 through the capacitor C1 which serves as an a.c. coupler.

Since the input signals A and $\overline{A}$ are opposite to each other in phase, the output currents of the transistors Tr11 and Tr12 will be supplied to the load resistor R5 through the coupling capacitor C1 in a push-pull relationship between these output currents.

By utilizing these current mirror circuits, a constant direct current will pass through the outputs of the transistors Tr11 and Tr12. This direct current functions as an idling current to compensate for the crossover distortion, even if there are no input signals A and $\overline{A}$.

Thus, the prior art amplifying circuit 1 must have an increased current mirror ratio (1:N) to improve the amplification factor thereof since the output amplification stages are connected with each other in the current mirror relationship. With a head-phone type stereo tape recorder, for example, it is preferred that the mirror ratio is about 1:120.

If the mirror ratio is increased, however, the idling current is also increased in a no-signal state. This results in an increase in current consumption.

If such a push-pull power amplifying circuit is to be constructed by the use of LSI, the mirror ratio should be defined by the ratio of emitter area in the transistors. This means that the emitters of these output transistors occupy an increased space, leading to an obstruction against the miniaturization of LSI.

It is therefore an object of the present invention to provide an improved amplifying circuit which can supply sufficient drive power to a load without an increase in the idling current.

SUMMARY OF THE INVENTION

To this end, the present invention provides an improved push-pull power amplifying circuit comprising a first drive transistor for amplifying a first input signal; a second drive transistor for amplifying a second input signal; a first diode-connected transistor for receiving the output current of said first drive transistor; a first output transistor connected to said first diode-connected transistor in a current mirror relationship; a second diode-connected transistor for receiving the output current of said second drive transistor; a second output transistor connected to said second diode-connected transistor in a current mirror relationship; a first control means for controlling the emitter current path of said second diode-connected transistor in response to a current corresponding to the output current of said first drive transistor; and a second control means for controlling the emitter current path of said first diode-connected transistor in response to a current corresponding to the output current of said second drive transistor.

On there being no signal, the emitter current paths of the first and second diode-connected transistors are turned ON to couple their output amplification stages in the mirror connection. Thus, the idling current is determined depending on the set mirror ratio. If the bias current or mirror ratio is set as small as possible, the idling current may be determined to be a necessary minimum level.

On the other hand, when an input signal is applied to the circuit, either of the first or second diode-connected transistor is switched off depending on the polarity of the input signal. As a result, the first or second diode-connected transistor which defines an output amplification stage becomes inoperative. Thus, all the output current of the first or second drive transistor will be supplied to the base of the first or second output transistor. Consequently, the first or second output transistor functions as a normal amplifying transistor, with the output current being a value corresponding to the current amplification factor $h_{FE}$ in the first or second output transistor. This amplification factor is set at a suitably high level.

DETAILED DESCRIPTION OF THE PREFERRED EMBODIMENTS

Overall Circuit Arrangement

Figure 1:
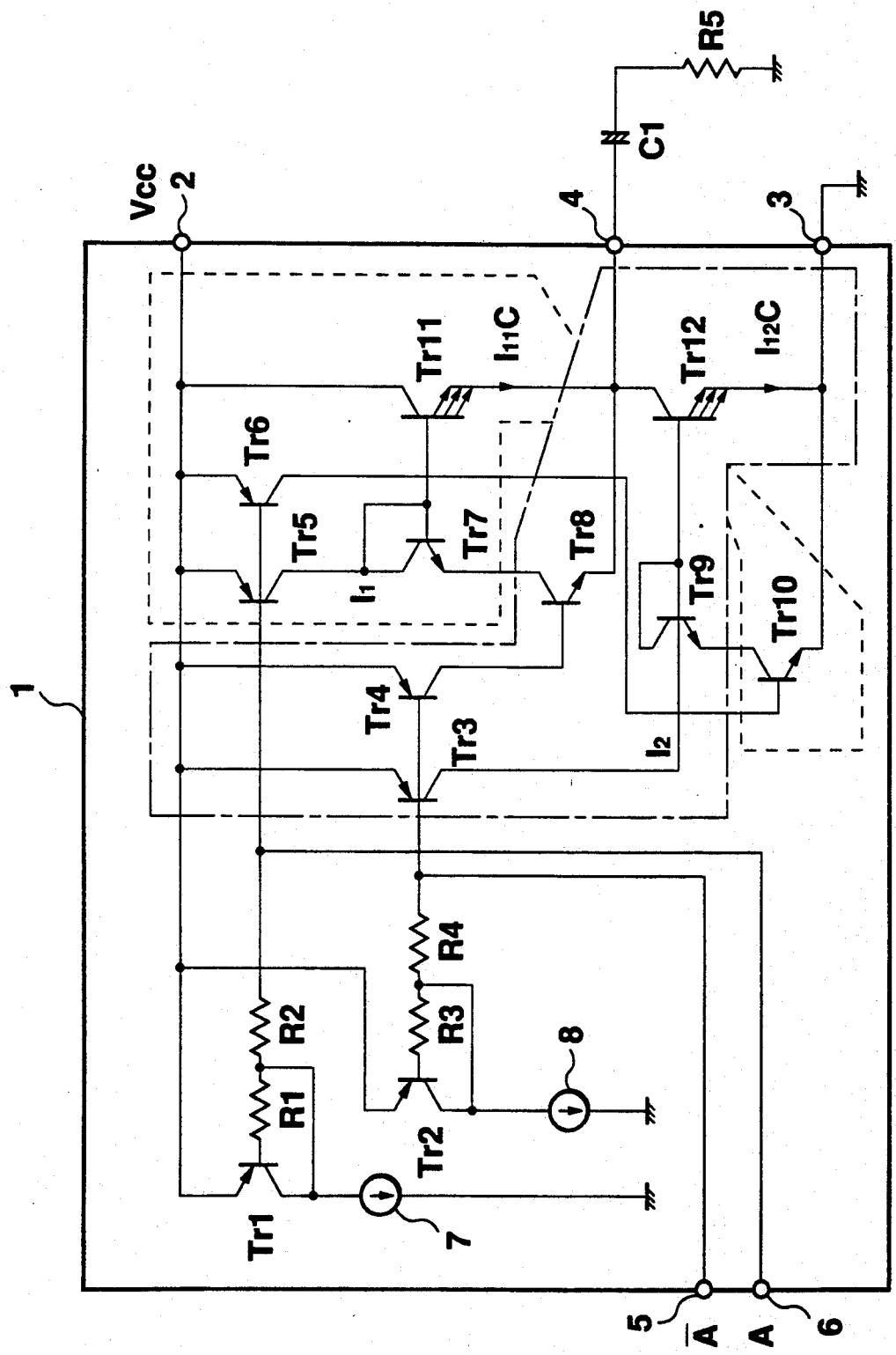
FIG. 1 is a circuit diagram of one embodiment of a push-pull power amplifying circuit constructed in accordance with the present invention.
Figure 2:
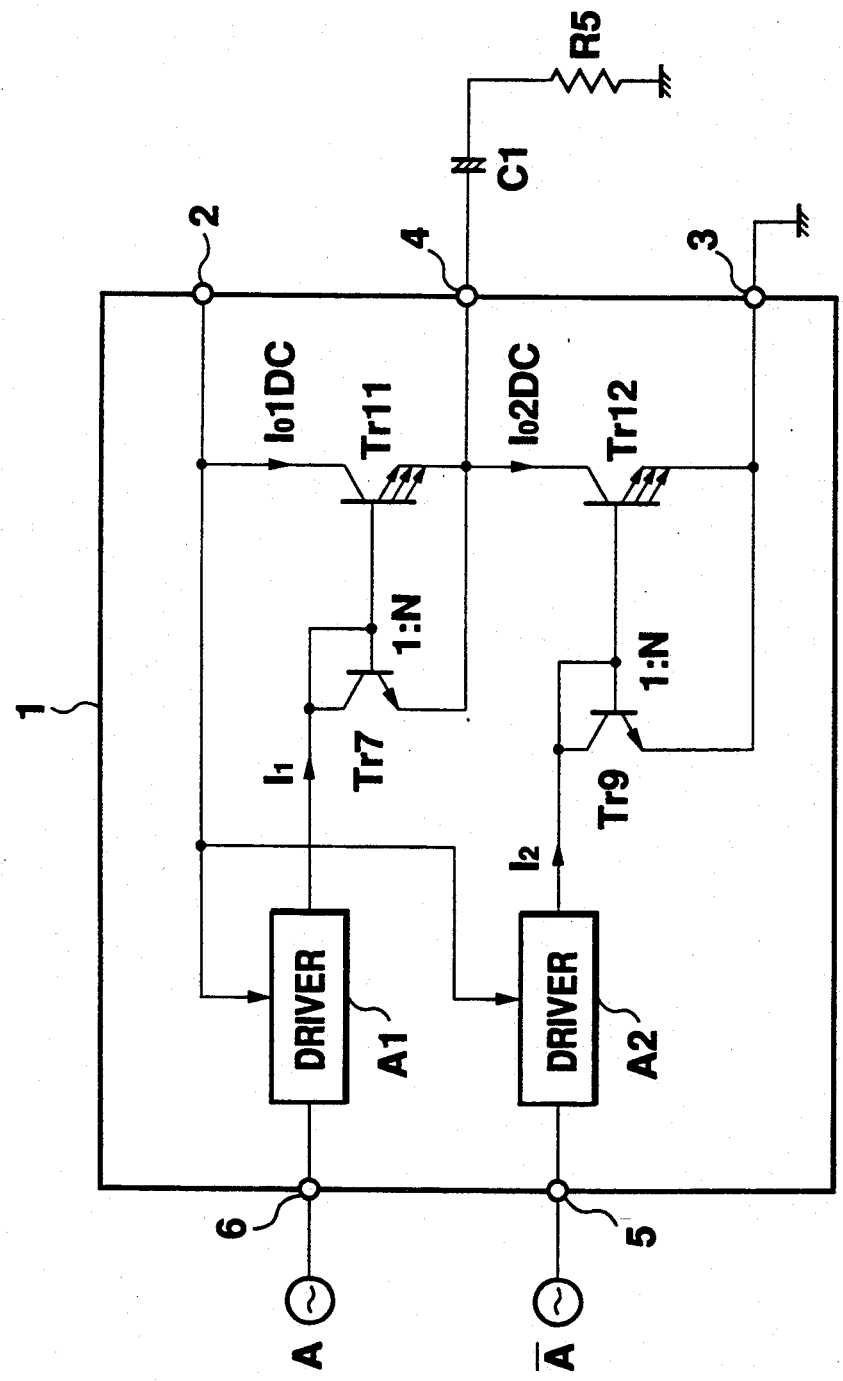
FIG. 2 is a circuit diagram of a B class push-pull power amplifying circuit constructed in accordance with the prior art, the circuit including a current mirror circuit.

Referring to FIG. 1, there is shown an amplifying circuit 1 which mainly comprises a first drive transistor Tr5, a second drive transistor Tr3, a first diode-connected transistor Tr7, a second diode-connected transistor Tr9, transistors Tr6 and Tr10 which define a first control means, transistors Tr4 and Tr8 which define a second control means, a first output transistor Tr11, a second output transistor Tr12, a first bias means and a second bias means.

The first bias means includes a transistor Tr1, a supply of current 7 and resistors R1 and R2. The second bias means includes a transistor Tr2, a supply of current 8 and resistors R3 and R4.

The first input terminal 6 is connected to the base of the first drive transistor Tr5 and the base of the first control means transistor Tr6 while the second input terminal 5 is connected to the base of the second drive transistor Tr3 and the base of the second control means transistor Tr4. These input terminals 5 and 6 will receive input signals A and A which are opposite to each other in phase.

At the same time, a bias current is supplied to the base of the first transistor Tr5 and the base of the first control means transistor Tr6, these bases being connected to the base of the transistor Tr1 in the first bias means, through the resistors R1 and R2 connected in series with each other, in the current mirror manner.

The intermediate junction between the resistors R1 and R2 in the first bias means is connected to the collector of the transistor Tr1 and the supply of current 7, the emitter of the transistor Tr1 being coupled with the power source terminal 2.

The bias current is also supplied to the base of the second drive transistor Tr3 and the base of the second control means transistor Tr4, these bases being coupled with the base of the transistor Tr2 in the second bias means, through the resistors R3 and R4 connected in series with each other, in the current mirror manner.

The intermediate junction between the resistors R3 and R4 in the second bias means is connected to the collector of the transistor Tr2 and the supply of current 8, the emitter of the transistor Tr13 being coupled with the power source terminal 2.

The source terminal 2 is also coupled with the emitter of the first drive transistor Tr5 and the emitter of the first control means transistor Tr6. The base of the first drive transistor Tr5 is connected with the base of the first control means transistor Tr6. The collector of the transistor Tr6 in the first control means is coupled with the base of the transistor Tr10 in the first control means. The collector of the first drive transistor Tr5 is connected to the collector and base of the first diode-connected transistor Tr7.

The output terminal 4 is connected to the emitter of the first output transistor Tr11 and the collector of the second output transistor Tr12 and further coupled with the resistor R5, which is a load, through a capacitor C1.

The source terminal 2 is further connected to the emitters of the second drive transistor Tr3 and the second control means transistor Tr4. The collector of the second drive transistor Tr3 is coupled with the base and collector of the second diode-connected transistor Tr9. The collector of the transistor Tr4 in the second control means is connected with the base of the second control means transistor Tr8.

The collector of the second control means transistor Tr8 is coupled with the emitter of the first diode-connected transistor Tr7 while the emitter of the second control means transistor Tr8 is connected to the output terminal 4.

The base and collector of the first diode-connected transistor Tr7 are coupled with the base of the first output transistor Tr11.

The base and collector of the second diode-connected transistor Tr9 are coupled with the base of the second output transistor Tr12, the emitter of the second diode-connected transistor Tr9 being connected to the collector of the transistor Tr10 in the first control means. The ground terminal 3 is coupled respectively with the emitter of the first control means transistor Tr10 and the emitter of the second output transistor Tr12.

Operation

It is now assumed that the ratios of the emitter areas between the transistors Tr7 and Tr11 and between the transistors Tr9 and Tr12 are 1:N.

The current mirror circuit of the present invention which is defined by the two pairs of transistors (Tr7 and Tr11; Tr9 and Tr12) is used to provide an idling current. The current mirror circuit will not be operative during the input of a signal. Thus, each of the emitter area ratios may be set to be the minimum ratio required to provide the necessary and sufficient idling current. In this embodiment, this area ratio is set to be about 1:12.

It is also assumed herein that the current passing through the transistor Tr7 is I1 while the current passing through the transistor Tr9 is I2.

In the state under which no signal is applied to either the first or the second input terminal 6 and 5, the first drive transistor Tr5, first control means transistor Tr6, second drive transistor Tr3 and second control means transistor Tr4 are placed ON. As a result, the control means transistors Tr10 and Tr8 are also placed ON. Thus, the current mirror circuit is made operative. The collector current I11C passing through the first output transistor Tr11 becomes N×I1 due to the mirror ratio. In this case, there is no alternating current component since no signal is applied to the circuit. Therefore, the collector current I11c becomes N×I1DC. On the other hand, the collector current I12C passing through the second transistor Tr12 also becomes: I12C=N×I2=-N×I2C.

In such a manner, the idling current when no signal is input is determined depending on the currents passing through the supplies of current 7 and 8 and the mirror ration N. If these parameters are suitably regulated, the first and second output transistors Tr11 and Tr12 are permitted to receive the minimum idling current required to prevent the occurrence of crossover distortion.

There will now be described a case where signals opposite to each other in phase (out of phase through 180 degrees) are inputted to the first and second input terminals 6 and 5.

It is assumed herein that the first input terminal 6 receives a positive signal while the second input terminal 5 receives a negative signal.

The transistors Tr5 and Tr6 are switched off in response to the positive signal applied to the first input terminal 6. The transistors Tr7 and Tr11 are also switched off while at the same time the transistors Tr9 and Tr10 also are switched off. Therefore, the second current mirror circuit no longer functions since the transistor Tr9 is OFF.

On the other hand, the transistors Tr3 and Tr4 are switched on in response to the negative signal applied to the second input terminal 5. As the transistor Tr4 is switched on, the transistor Tr8 is also switched on, but subject to no influence since the transistor Tr7 is not switched on.

Since the transistors Tr9 and Tr10 are in their OFF state, all the output current of the transistor Tr3 is supplied to the base of the transistor Tr12 wherein the current is amplified up to a level corresponding to the amplification factor $h_{FE}$ of the transistor Tr12. In such a manner, a sufficiently large output current may be provided since the amplification factor $h_{FE}$ of the normal NPN transistor is ranged between 100 and 200. In this embodiment, the transistor Tr12 has its amplification factor $h_{FE}$ equal to 120.

There will now be described a case where a negative signal is applied to the first input terminal 6 and a positive signal is applied to the second input terminal 5.

In response to the positive signal applied to the second input terminal 5, the transistors Tr3 and Tr4 are switched off. Thus, the transistors Tr9 and Tr 12 are also switched off while at the same time the transistors Tr7 and Tr8 are also switched off.

In response to the negative signal applied to the first input terminal 6, the transistors Tr5 and Tr6 are switched on. As the transistor Tr6 is switched on, the transistor Tr10 is also switched on, but subject to no influence since the transistor Tr9 is in its OFF state.

Since the transistors Tr7 and Tr8 are switched off, all the output current of the transistor Tr5 is supplied to the base of the transistor Tr11 wherein the current is amplified up to a level corresponding to the amplification factor $h_{FE}$ of the transistor Tr11. In such a manner, a sufficiently large output current may be provided as described hereinbefore.

When the signals are inputted into the circuit, the collector current I11C passing through the transistor Tr11 becomes:

$$h_{FE} \times I1 = h_{FE} \times (I1DC + I1AC).$$

The collector current I12C passing through the transistor Tr12 becomes:

$$h_{FE} \times I2 = h_{FE} \times (I2DC + I2AC).$$

Thus, each of the output transistors Tr11 or Tr12 functions as a normal amplifying transistor independently of the current mirror circuit when input signals are applied to the circuit. Consequently, a sufficiently large amplification degree may be secured irrespective of the set mirror ratio.

As described, the input signal is determined depending on the current amplification factor $h_{FE}$ of the transistor. Even when a sufficiently high amplification factor is called for, it is not necessary to increase the mirror ratio. Since the mirror ratio N is only used to set the level of the idling current, it may be set as small as about 12.

In addition, if the push-pull power amplifying circuit is to be constructed by the use of LSI, it may be miniaturized by reducing the necessary emitter area since the mirror ratio is set to be at a relatively small level.

It will be apparent from the foregoing that the present invention has an advantage in that a higher power can be supplied to the load without an increase in the idling current under nosignal conditions when the input signals are to be push-pull amplified. In such a case, since the area of the output transistor can be decreased, the area of LSI chip used therein may also be reduced.

We claim:

1. A push-pull power amplifying circuit, comprising:
   (A) a first drive transistor for amplifying a first input signal;
   (B) a second drive transistor for amplifying a second input signal;
   (C) a first current mirror circuit including a first diode-connected transistor for receiving the output current from said first drive transistor, and a first output transistor connected to said first diode-connected transistor;
   (D) a second current mirror circuit including a second diode-connected transistor for receiving the output current of said second drive transistor, and a second output transistor connected to said second diode-connected transistor;
   (E) a first control means for ON-OFF controlling the emitter current path of said second diode-connected transistor in response to a current corresponding to the output current of said first drive transistor; and
   (F) a second control means for ON-OFF controlling the emitter current path of said first diode-connected transistor in response to a current corresponding to the output current of said second drive transistor.

2. A push-pull power amplifying circuit as defined in claim 1 wherein the mirror ratio in each of the current mirror circuits defined by the diode-connected transistor and the output transistor is set at a relatively small level for providing an idling current required to compensate for any crossover distortion.

3. A push-pull power amplifying circuit as defined in claim 1 or 2 wherein each of the output transistors has an amplification factor $h_{FE}$ so as to provide a sufficiently large amplification degree when the input signal is applied to that output transistor.

4. A push-pull power amplifying circuit as defined in claim 1 wherein each of said first and second control means includes a transistor coupled with the associated drive transistor through the respective bases and through the respective emitters, and another transistor ON-OFF controlled by this transistor so as to ON-OFF control the emitter current path of the associated diode-connected transistor.

5. A push-pull amplifying circuit formed into the form of an IC, comprising:
   (A) a first drive transistor for amplifying an audio reproducing input signal;
   (B) a second drive transistor for amplifying an inverted signal opposite to said input signal;
   (C) a first current mirror circuit including a first diode-connecting transistor for receiving the output current from said first drive transistor, and a first output transistor connected to said first diode-connected transistor in a current mirror manner, said first current mirror circuit having its mirror ratio determined by the emitter areas of said first diode-connected transistor and said first output transistor;
   (D) a second current mirror circuit including a second diode-connected transistor for receiving the output current of said second drive transistor, and a second output transistor connected to said second diode-connected transistor in a current mirror manner, said second current mirror circuit having its mirror ratio determined by the emitter areas of said second diode-connected transistor and said second output transistor;
   (E) a first control means controllable by a current corresponding to the output current of said first drive transistor, said first control means switching the emitter current path of said second diode-connected transistor on to complete the second current mirror circuit such that a small idling current determined by said mirror ratio can pass through said second current mirror circuit when no signal is inputted into the circuit, and also switching the emitter current path of said second diode-connected transistor off to make said second current mirror circuit inoperative when any signal is inputted into the circuit, and said first output transistor amplifying the output of said first drive transistor depending on the amplification degree of said first output transistor; and
   (F) a second control means controllable by a current corresponding to the output current of said second drive transistor, said second control means switching the emitter current path of said first diode-connected transistor on to complete the first current mirror circuit such that a small idling current determined by said mirror ratio can pass through said first current mirror circuit when no signal is inputted into the circuit, and also switching the emitter current path of said first diode-connected transistor off to make said first current mirror circuit inoperative when any signal is inputted into the circuit, said second output transistor amplifying the output of said first drive transistor depending on the amplification degree of said second output transistor.

* * * * *